(12) United States Patent
Hueting et al.

(10) Patent No.: US 6,774,434 B2
(45) Date of Patent: Aug. 10, 2004

(54) FIELD EFFECT DEVICE HAVING A DRIFT REGION AND FIELD SHAPING REGION USED AS CAPACITOR DIELECTRIC

(75) Inventors: Raymond J. E. Hueting, Helmond (NL); Jan W. Slotboom, Eersel (NL); Petrus H. C. Magnee, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/293,993

(22) Filed: Nov. 12, 2002

(65) Prior Publication Data

US 2003/0094649 A1 May 22, 2003

(30) Foreign Application Priority Data

Nov. 16, 2001 (GB) .............................. 0127479
Dec. 17, 2001 (GB) .............................. 0130019
Sep. 20, 2002 (GB) .............................. 0221839

(51) Int. Cl.$^7$ ............................................ H01L 29/76
(52) U.S. Cl. .................. 257/340; 257/152; 257/153; 257/154; 257/242; 257/302; 257/335
(58) Field of Search ............................... 257/152–154, 257/242, 302, 335, 336–347

(56) References Cited

U.S. PATENT DOCUMENTS

| 4,754,310 A | | 6/1988 | Coe ............................ 357/13 |
| 5,237,193 A | * | 8/1993 | Williams et al. |
| 5,306,656 A | * | 4/1994 | Williams et al. |
| 5,485,027 A | * | 1/1996 | Williams et al. |

FOREIGN PATENT DOCUMENTS

WO    WO0159847    8/2001    ........... H01L/29/78

OTHER PUBLICATIONS

N. Thapar et al; "The Accumulation Channel Driven Bipolar Transistor (ACBT): A New MOS–Gated Semiconductor Power Device", Powre Semiconductor Devices and IC's, 1997. ISPSD'97, IEEE International Syposium on Weimar, Germany May 26–29, 1997, New York USA, pp. 201–204, XP010232433.

* cited by examiner

*Primary Examiner*—Fetsum Abraham
(74) *Attorney, Agent, or Firm*—Aaron Waxler

(57) ABSTRACT

A field effect transistor semiconductor device (1) comprises a source region (33), a drain region (14) and a drain drift region (11), the device having a field shaping region (20) adjacent the drift region (11) and arranged such that, in use, when a voltage is applied between the source (33) and drain (14) regions and the device is non-conducting, a substantially constant electric field is generated in the field shaping region (20) and accordingly in the adjacent drift region (11). The field shaping region (20), which may be intrinsic semiconductor, is arranged to function as a capacitor dielectric region (20) between a first capacitor electrode region (21) and a second capacitor electrode region (22), the first and second capacitor electrode regions (21, 22) being adjacent respective ends of the dielectric region (20) and having different electron energy barriers. The first and second capacitor electrode regions (21, 22) may be opposite conductivity semiconductor regions, or they may be a semiconductor region (21) and a Schottky barrier region (224, FIG. 4). The device may be an insulated gate device (1, 13, 15, 17, 171, 172, 19, 12) particularly suitable for high or low voltage DC power applications, or a Schottky gate device (181, 182, 183) particularly suitable for RF applications.

18 Claims, 9 Drawing Sheets

FIELD EFFECT DEVICE HAVING A DRIFT REGION AND FIELD SHAPING REGION USED AS CAPACITOR DIELECTRIC

This invention relates to a field effect transistor semiconductor device and is particularly, though not exclusively, concerned with the trade off relationship between the on-resistance and the breakdown voltage of the device.

It is well known that the voltage blocking capability of a field effect transistor device can be increased by reducing the dopant concentration and increasing the size of the drain drift region. However, this also increases the resistivity and length of the majority charge carrier path through the device when the device is conducting. This means that the series resistivity of the current path for majority charge carriers through the device, and thus the on-resistance of the field effect device, increases in proportion to approximately the square of the desired breakdown voltage.

U.S. Pat. No. 4,754,310, the contents of which are hereby incorporated herein by reference, (our reference PHB32740) addresses this problem by providing the drain drift region as a zone formed of first regions of one conductivity type interposed with second regions of the opposite conductivity type with the dopant concentrations and dimensions of the first and second regions being such that, when the device is operated in voltage blocking mode and the zone is depleted of free charge carriers, the space charge per unit area in the first and second regions balances at least to the extent that the electric field resulting from the space charge is less than the critical field strength at which avalanche breakdown would occur. This enables the required breakdown voltage characteristics to be obtained using interposed semiconductor regions which individually have a higher dopant concentration, and thus lower resistivity, than would otherwise be required so that the series resistivity of the first and second regions and thus the on-resistance of the device can be lower than for conventional devices.

For best results using the invention of U.S. Pat. No. 4,654,310 the charge balance between each pole in the drain drift region needs to be precise. That is to say the integral of the doping concentration perpendicular to the junction of the two interposed regions of one conductivity type and opposite conductivity type needs to have the same value of about $2 \times 10^{12}$ cm$^{-2}$. Doping concentration to this level of precision in integrated circuit processing techniques is difficult, and a small fluctuation in doping concentration in either of the two regions results in a correspondingly large deviation from the desired charge balance along the drain drift region and a corresponding large reduction in the breakdown voltage of the device.

International patent application published as WO01/59847, the contents of which are hereby incorporated herein by reference, (our reference PHNL 000066) provides another way of improving the trade off between breakdown voltage and on resistance in the case of vertical high voltage insulated gate field effect devices. Field shaping regions extend through the drain drift region from the body regions of the device to the drain region. These field shaping regions are semi-insulative or resistive regions which provide current leakage paths from the source regions when the device is non-conducting and a voltage is applied between the main electrodes of the device so as to cause an extension of a depletion region in the drain drift region towards the drain region to increase the breakdown voltage of the device. The small leakage current along the resistive paths causes a linear electrical potential drop along these paths. Hence a substantially constant vertical electric field is generated along these paths and accordingly in the adjacent drain drift region, and this results in the breakdown voltage being greater than for a non-uniform electric field which would occur in the absence of the field shaping region. Thus, as for the invention of U.S. Pat. No. 4,754,310, for a given required breakdown voltage of the device, it is possible to increase the doping concentration of the drain drift region and hence reduce the on-resistance of the device compared with a conventional device.

An object of the present invention is to provide a field effect transistor semiconductor device which also has a field shaping region adjacent the drift region but in which the substantially constant electric field is generated in the field shaping region in a different manner and by a different structure.

According to the present invention there is provided a field effect transistor semiconductor device comprising a source region, a drain region and a drain drift region, the device having a field shaping region adjacent the drift region and arranged such that, in use, when a voltage is applied between the source and drain regions and the device is non-conducting, a substantially constant electric field is generated in the field shaping region and accordingly in the adjacent drift region, characterised in that the field shaping region is arranged to function as a capacitor dielectric region between a first capacitor electrode region and a second capacitor electrode region, the first and second capacitor electrode regions being adjacent respective ends of the dielectric region and having different electron energy barriers.

By substantially constant electric field it is meant herein that the maximum electric field in the field shaping region and hence in the adjacent drift region at a given voltage is reduced in comparison with the absence of the field shaping region with the consequence that the breakdown voltage of the device is comparatively greater. Associated with the reduced maximum electric field is an increased integral of the electric field along the length of the field shaping region and the drift region and hence the greater breakdown voltage. It is possible to have a perfectly uniform electric field along both the field shaping region and the adjacent drift region but that depends on a number of factors including the device geometry, for example the extent of the field shaping region along the length of the drift region and the extent of influence of the field shaping region across the width of the drift region.

In a device according to the present invention, it is the different electron energy barriers of the first and second capacitor electrode regions which ensure that in use, when a voltage is applied between the source and drain regions and the device is non-conducting, the field shaping region functions as a capacitor dielectric region rather than a resistive region, there is substantially no space charge in the field shaping region, and within the drift region there is a charge balance between the space charge in the first capacitor electrode region, together with the drain drift region, and the second capacitor electrode region. That is to say, the charge in the drain drift region plus the charge in the first capacitor electrode region compensates the charge of, the second capacitor electrode region. It is an applied voltage which capacitively generates the substantially constant electric field in the field shaping region in the present invention rather than the leakage current applied through the field shaping region which is provided in the arrangement disclosed in WO01/59847. Also, the problem with the arrangement of U.S. Pat. No. 4,754,310 of providing a precise charge balance between the two opposite conductivity type regions along the length of the drift region does not arise in the arrangement of the present invention.

In a device according to the present invention, the capacitor dielectric region may be intrinsic semiconductor material, or it may be extrinsic semiconductor material which is lower doped than the drift region, or it may be semi-insulating material, for example comprising one of oxygen doped polycrystalline silicon and nitrogen doped polycrystalline silicon.

In a device according to the invention, the capacitor dielectric region may be separated from the drain drift region by an insulating region. This insulating region tends to inhibit the possibility of conduction between the capacitor dielectric region and the drain drift region, and it is also advantageous for the device performance regarding interface states. It may be possible that because of the non-ideal interfaces parasitic charge is induced. These interface states are reduced by an insulating layer. However, the electric field produced in the drift region will still be sufficiently uniform for the purpose of this invention in the absence of this insulating region.

In a device according to the invention, the first capacitor electrode region may be a semiconductor region of one conductivity type with the second capacitor electrode region being a semiconductor region of opposite conductivity type to the first capacitor electrode region. In this case the different electron energy barriers of the first and second capacitor electrode regions are provided by the different work functions of the two semiconductor conductivity types. Alternatively, the first capacitor electrode region may be a semiconductor region with the second capacitor electrode region being a Schottky barrier region. In this case the work function of the first capacitor electrode semiconductor region is an electron energy barrier which is different from the Schottky electron energy barrier of the second capacitor electrode Schottky barrier region. In both cases as just specified, the first capacitor electrode region semiconductor region is of the same conductivity type as the drain region.

In a device according to the invention, the transistor may be an insulated gate field effect transistor. This may be a vertical transistor which may be a trench-gate transistor.

The invention of W001/59847 discussed above is disclosed in relation to vertical high voltage insulated gate field effect devices. The vertical trench-gate transistor devices as defined just above in accordance with the invention may also be high voltage devices, that is with breakdown voltages above about 200 volts, where the on resistance of the device is mainly determined by the resistance of the drain drift region. However, for reasons explained later, these vertical trench-gate devices in accordance with the invention may also be medium or low voltage devices, that is with breakdown voltages respectively below about 200 volts or below about 50 volts. For 50 volts and less the on resistance of the device is mainly determined by the resistance of the channel accommodating region. For these medium and low voltage devices it is advantageous, for reasons also explained later, to have the gate insulation at the bottom of the trench-gate greater than the gate insulation adjacent the channel accommodating region so as to reduce the gate to drain charge of the transistor. In this case, the gate insulation at the bottom of the trench-gate may be of the same material as the gate insulation adjacent the channel accommodating region but of greater thickness.

In a device according to the invention where the transistor is an insulated gate field effect transistor, this may be a lateral transistor having the source region, the drain region and the drift region underneath a top major surface of the device, wherein a planar insulated gate is above said top major surface, and wherein the capacitor dielectric region and the first and second capacitor electrode regions are above said top major surface. Alternatively, the insulated gate field effect transistor may be a lateral transistor having the source region, the drain region and the drain drift region underneath a top major surface of the device, wherein the drain drift region is divided into laterally spaced sections, and wherein the capacitor dielectric region is underneath the top major surface and is divided into laterally spaced sections which alternate with the drain drift sections. In this case, the insulated gate may extend below the top major surface at the end of the drain drift sections opposite the drain region, or a planar insulated gate may be above the top major surface.

In an insulated gate field effect transistor device according to the invention, the transistor may be an insulated gate bipolar transistor having a semiconductor region of opposite conductivity type to the drain region between the drain region and a drain electrode.

The field effect transistor devices according to this invention may be used in direct current power applications. They may also be used in radio frequency applications. The effect of the field shaping region is not only to enable the on resistance of the device to be decreased for a given breakdown voltage which is important for DC power applications, but also to increase the cut off frequency for a given breakdown voltage which is important for RF applications. Also, the fact that the field shaping region functions as a capacitor dielectric region rather than a resistive region (as is the case for example in W001/59847), and that there is substantially no space charge in the field shaping region when a voltage is applied between the source and drain regions, improves the switching speed of the device which is important for RF applications. In the case specified above where the second capacitor electrode region is a semiconductor region, then the switching speed may be improved by choice of the type of semiconductor for this second capacitor electrode region, for example by choosing silicon-germanium rather than silicon. Furthermore, the switching speed is improved in the case specified above where the second capacitor electrode region is a Schottky barrier region rather than a semiconductor region. Where the devices are insulated gate field effect transistor devices as specified above, then the above-specified lateral transistor devices are particularly suitable for RF applications.

In a device according to the invention, instead of the transistor being an insulated gate field effect transistor it may be a Schottky gate field effect transistor. Schottky gate field effect transistors are known to be suitable for RF applications. The Schottky gate field effect transistor in a device according to the invention may be a vertical transistor. Alternatively this transistor may be a lateral transistor having the source region, the drain region and the drain drift region underneath a top major surface of the device, wherein the Schottky-gate is above said top major surface, and wherein the capacitor dielectric region and the first and second capacitor electrode regions are above said top major surface.

In a device according to the invention there are different possibilities for connection of the first and second capacitor electrode regions to device electrodes. In one case, the first and second capacitor electrode regions may be respectively connected to drain and source electrodes. In another case, the first and second capacitor electrode regions may be respectively connected to drain and gate electrodes. In yet another case, at least one of the first and second capacitor electrode regions may be connected to an electrode which is not a drain, source or gate electrode. A possible advantageous use for this last case is where the device is an RF power device so that only a constant DC voltage, or current, may be applied to the field shaping region via the first and second capacitor electrode regions while the drain source and gate electrodes are used for application of the RF signal together with this constant DC voltage, or current.

In a device according to the invention, except for the last case for connection of the first and second capacitor electrode regions mentioned just above, the first capacitor electrode region may be integral with the drain region.

Embodiments of the present invention will now be described, by way of example, with reference to the accompanying diagrammatic drawings, in which.

Figure 1:
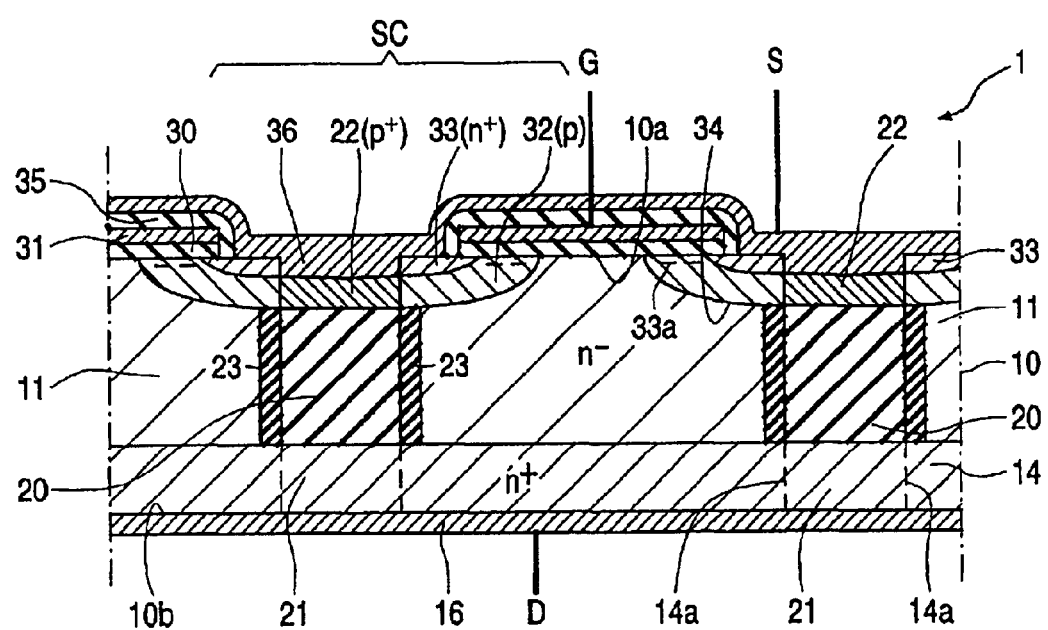
FIG. 1 shows a diagrammatic cross-sectional view through part of an embodiment of a planar gate vertical insulated gate field effect transistor semiconductor device in accordance with the present invention.
Figure 5A:
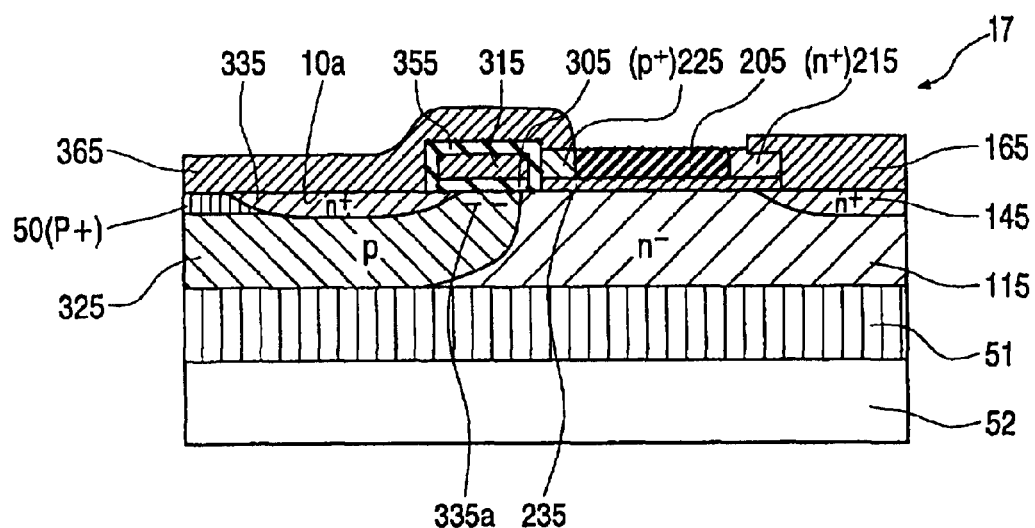
Figure 5B:
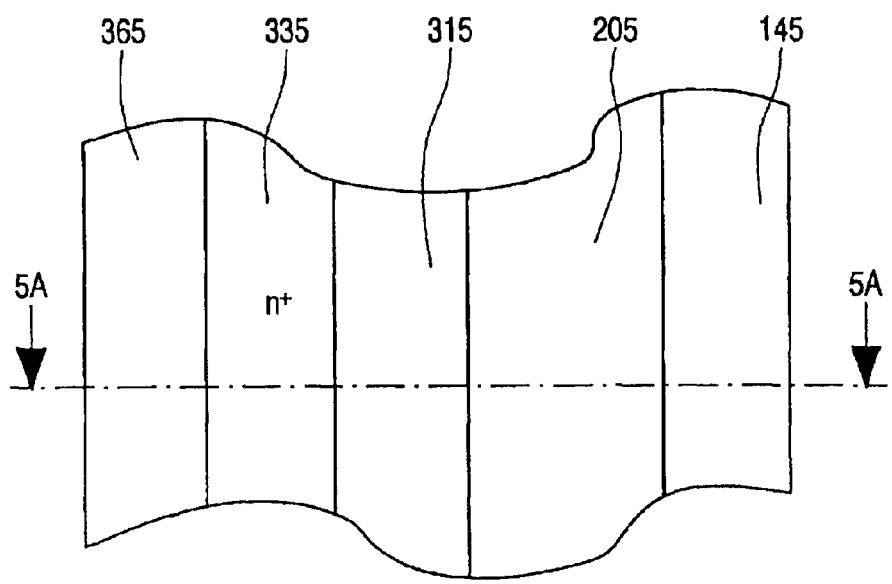
Figure 6A:
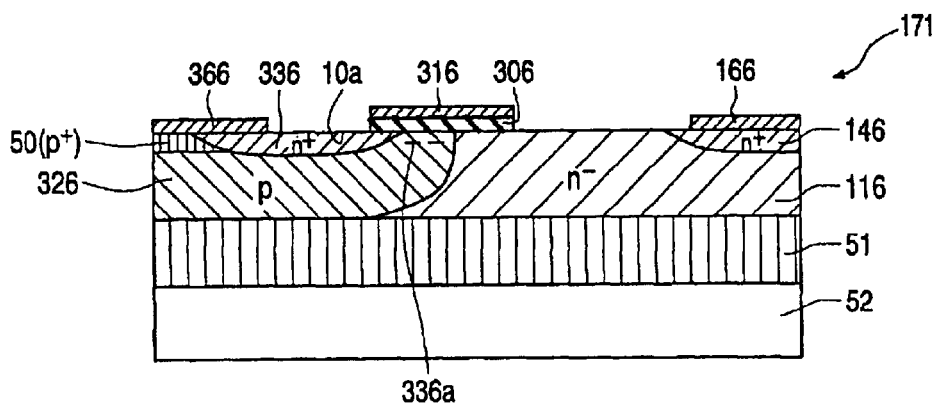
Figure 6B:
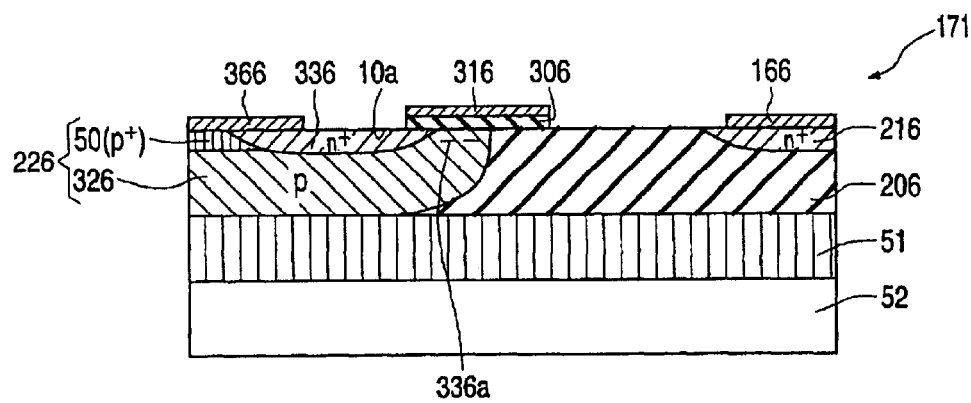
Figure 6C:
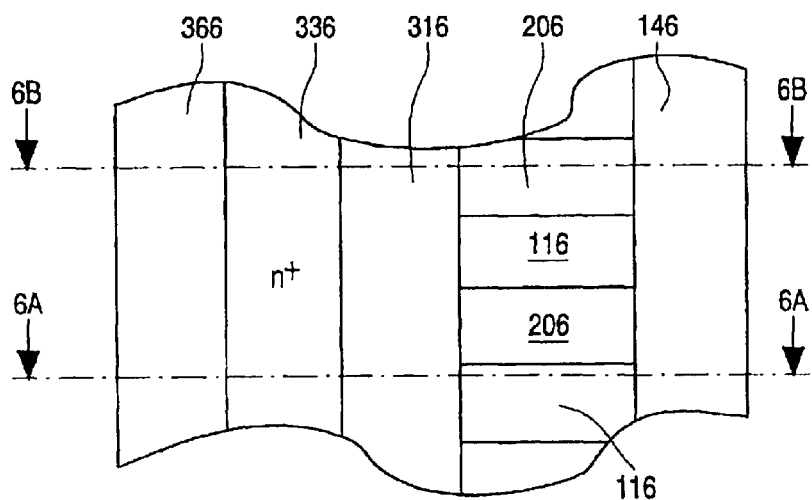
Figure 7A:
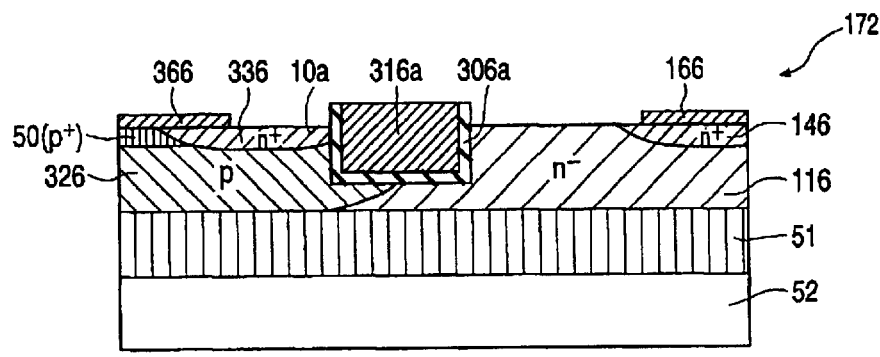
Figure 7B:
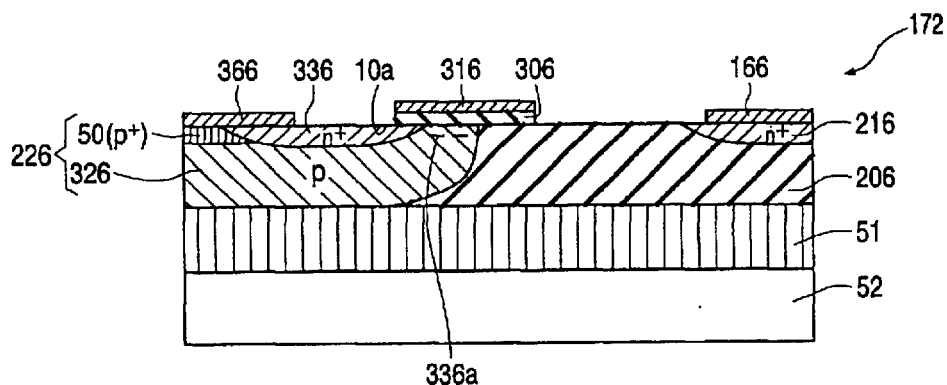
Figure 7C:
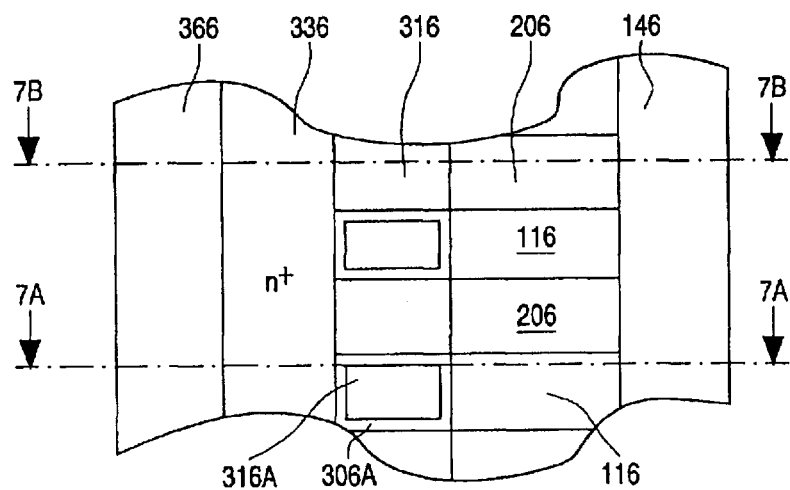
Figure 8:
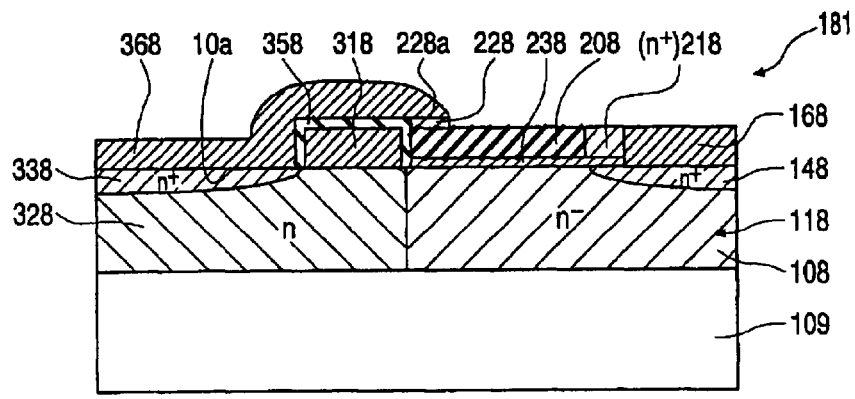
Figure 9:
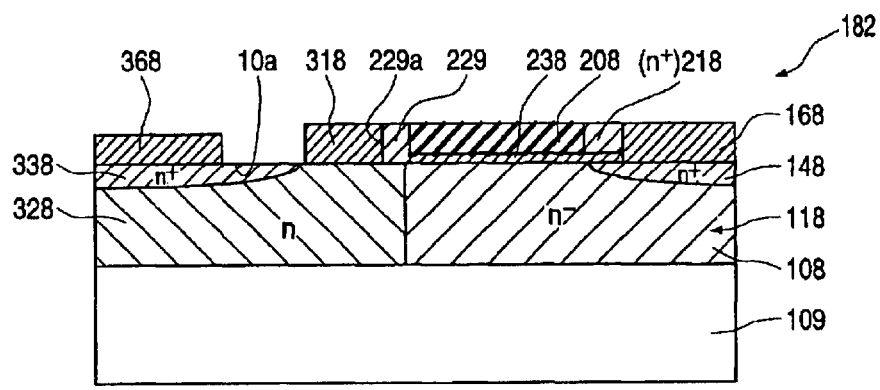
Figure 10:
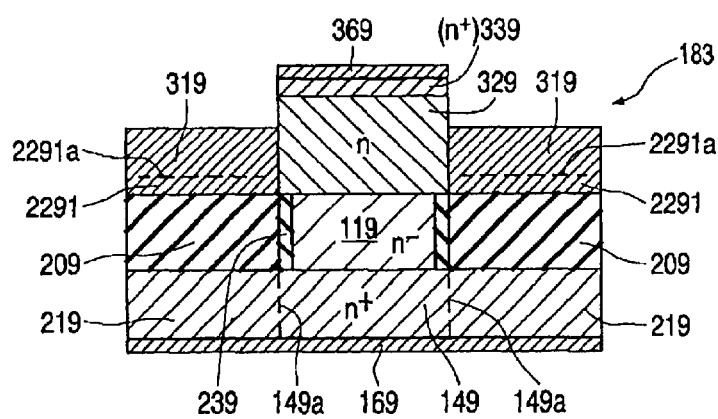
Figure 11:
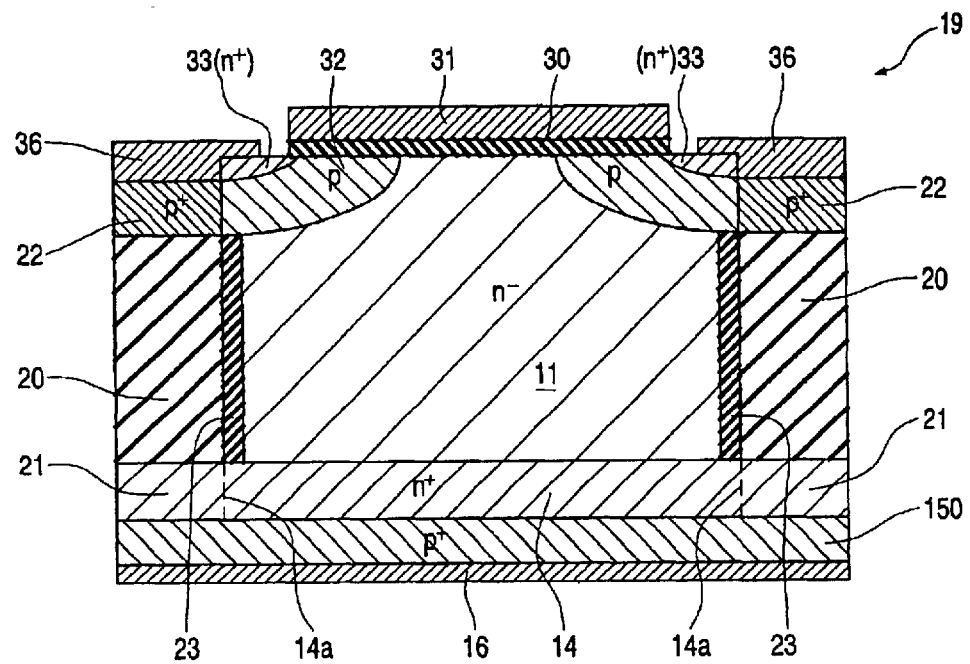
Figure 12:
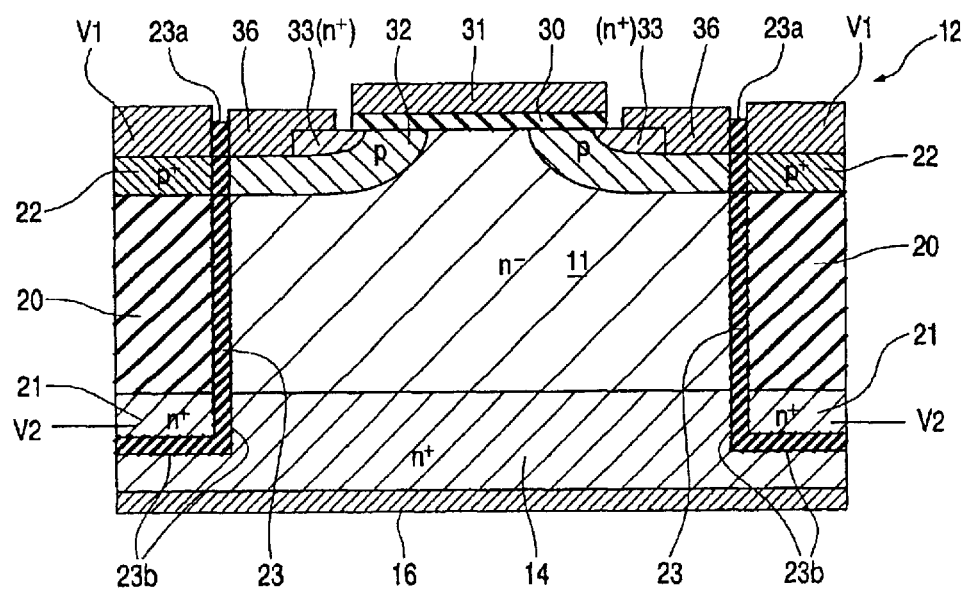

FIGS. 5A and 5B respectively show a diagrammatic cross-sectional view through and a plan view of part of one embodiment of a planar gate lateral insulated gate field effect transistor semiconductor device in accordance with the present invention;

FIGS. 6A, 6B and 6C respectively show two diagrammatic cross-sectional views through and a plan view of part of another embodiment of a planar gate lateral insulated gate field effect transistor semiconductor device in accordance with the present invention;

FIGS. 7A, 7B and 7C respectively show two diagrammatic cross-sectional views through and a plan view of part of an embodiment of a lateral trench-gate field effect transistor semiconductor device in accordance with the present invention;

FIGS. 8 and 9 respectively show a diagrammatic cross-sectional view through part of two embodiments of a lateral Schottky gate field effect transistor semiconductor device in accordance with the present invention;

FIG. 10 shows a diagrammatic cross-sectional view through part of an embodiment of a vertical Schottky gate field effect transistor semiconductor device in accordance with the present invention;

FIG. 11 shows a diagrammatic cross-sectional view through part of an embodiment of an insulated gate bipolar transistor semiconductor device which, in accordance with the invention, is a modification of the embodiment of the planar gate vertical insulated gate field effect transistor semiconductor device shown in FIG. 1; and FIG. 12 shows a diagrammatic cross-sectional view through part of an embodiment of a planar gate vertical insulated gate field effect transistor semiconductor device in accordance with the invention, which is a modification of the device shown in FIG. 1.

It should be noted that the Figures are diagrammatic, relative dimensions and proportions of parts having been shown exaggerated or reduced in size for the sake of clarity and convenience. The same reference signs are generally used to refer to corresponding or similar features.

Referring now to FIG. 1, this shows a planar gate vertical insulated gate field effect transistor semiconductor device 1. The device 1 comprises a monocrystalline silicon semiconductor body 10 having first and second opposed major surfaces 10a and 10b. The semiconductor body 10 comprises a relatively highly doped substrate 14 of one conductivity type, n+ conductivity type in this example, which forms the drain region of the device. A relatively lowly doped semiconductor region 11 of the one conductivity type, (n−) conductivity type in this example, forms a drain drift region of the device. Typically, the dopant concentration within the drain drift region 11 is $10^{16}$ atoms cm$^{-3}$.

An insulated gate structure G consisting of a gate dielectric layer 30 and a gate conductive layer 31 is provided on the first major surface 10a. As is known in the art, the insulated gate structure G, when viewed in plan looking down on the surface 10a, defines a regular mesh or grid having openings in each of which is formed a source cell SC consisting of a body region 32 of the opposite conductivity type (p conductivity type in this example) forming a pn junction 34 with the drain drift region 11 and containing a source region 33 of the one conductivity type (n+ conductivity type in this example) so that part of the body region 32 defines with the source region 33 a conduction channel region 33a under the insulated gate structure G through which a conduction channel is controlled by means of a voltage applied to the insulated gate structure G. Each source cell SC may have, for example, a square, hexagonal, stripe or circular geometry.

An insulating region 35 is provided over the gate structure G. Source metallisation 36 contacting all of the source regions 33 is provided on the first major surface 10a over the insulating region 35 to provide a source electrode S. Although not shown, electrical connection to the insulated gate structure G is provided by formation of one or more windows through the insulating region 35 to expose part of the gate conductive layer 31 and patterning of the source metallisation to provide a separate gate electrode. A metallisation layer 16 forms an ohmic contact with the drain region 14 so as to provide a drain electrode D.

Although FIG. 1 shows only one complete source cell SC, in practice the transistor device 1 will typically consist of many parallel connected source cells sharing the common drain region 14. The device 1 is a vertical device, that is in which the main current path from the source regions 33 to the drain region 14 is in a direction perpendicular to the first and second major surfaces 10a and 10b.

The structure of the device 1 described so far forms a conventional vertical DMOSFET. However, in contrast to a conventional DMOSFET, the device 1 has a plurality of electric field shaping regions 20 distributed throughout the main drift region 11 such that each source cell SC is associated with an electric field shaping region 20. Thus the part of the drift region 11 centred on the full section of the insulated gate structure G as shown in FIG. 1 has a field shaping region 20 adjacent either side of that part of the drift region 11. Each field shaping region 20 has a first capacitor electrode region 21 which is integral with the n+ drain region 14, as shown between the dotted lines 14a, adjacent the lower end of the region 20. Each field shaping region 20 also has a second capacitor electrode region 22, being a p+ conductivity type semiconductor region, adjacent the upper end of the region 20. The p+ second capacitor electrode region 22 is adjacent a body region 32 at each side and is connected to the source electrode S.

The field shaping region 20 is separated from the drift region 11 at each side by an insulating region 23, which is typically silicon dioxide. This insulating region 23 is optional.

The different electron energy barriers provided by the different work functions of the n+ semiconductor first capacitor electrode region 21 and the p+ semiconductor second capacitor electrode region 22 ensure that in use, when a voltage is applied between the source region 33 and the drain region 14, that is between the source and drain electrodes S and D, and the device 1 is non-conducting a substantially constant electric field is generated in each field shaping region 20 and accordingly in the adjacent drift region 11. It is an applied voltage which capacitively generates the substantially constant electric field in the field shaping region 20. Thus, in these conditions, each field shaping region 20 functions as a capacitor dielectric region, there is substantially no space charge in this capacitor dielectric field shaping region 20, and within the drift region 11 there is a charge balance between the space charge in the first capacitor electrode region 21, together with the drain drift region 11, and the second capacitor electrode region 22. That is to say, the charge in the drain drift region 11 plus the charge in the first capacitor electrode region 21 compensates the charge of the second capacitor electrode region 22. When the device 1 is conducting, paths through the regions 20 will simply add a small source-drain current parallel to the main source-drain current path through the drain drift region 11.

The capacitor dielectric field shaping region 20 region may be intrinsic semiconductor material, or it may be extrinsic semiconductor material (p-type or n-type conductivity) which is lower doped than the drift region, or it may be semi-insulating material, for example being either oxygen doped polycrystalline silicon or nitrogen doped polycrystalline silicon.

The substantially constant vertical electric field generated along the capacitor dielectric regions 20 and accordingly in the adjacent drain drift region 11 results in the breakdown voltage being greater than for a non-uniform electric field which would occur in the absence of the field shaping capacitor dielectric regions. Thus, for a given required breakdown voltage of the device 1, it is possible to increase the doping concentration of the drain drift region 11 and hence reduce the on-resistance of the device compared with a conventional device.

The device 1 described above with reference to FIG. 1 may be used in direct current power applications. It may also be used in radio frequency applications. The effect of the field shaping region 20 is not only to enable the on resistance of the device 1 to be decreased for a given breakdown voltage which is important for DC power applications, but also to increase the cut off frequency for a given breakdown voltage which is important for RF applications. Also, the fact that the field shaping region 20 functions as a capacitor dielectric region, and that there is substantially no space charge in the field shaping region 20 when a voltage is applied between the source 33 and drain 14 regions and the device is non-conducting, improves the switching speed of the device which is important for RF power applications. In the case described above where the second capacitor electrode region 22 is a semiconductor region, then the switching speed may be improved by choice of the type of semiconductor for this second capacitor electrode region 22, for example by choosing silicon-germanium rather than silicon.

Figure 2A:
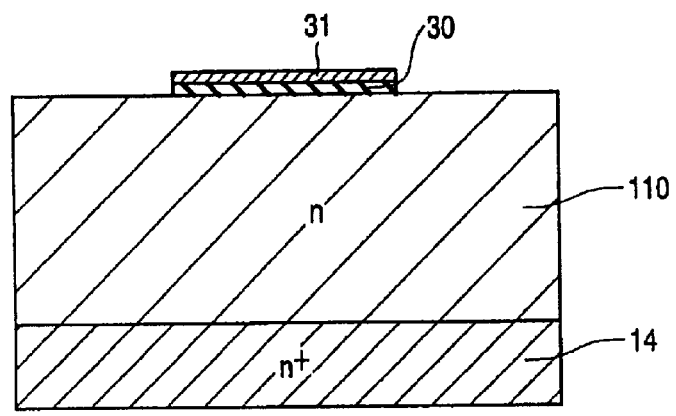
FIGS. 2A to 2E illustrate steps in one example of a method that may be used in manufacturing the device shown in FIG. 1.
Figure 2B:
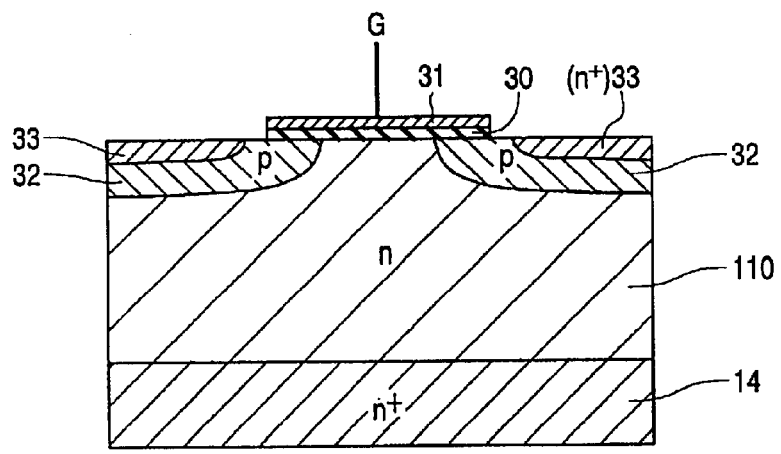
Figure 2C:
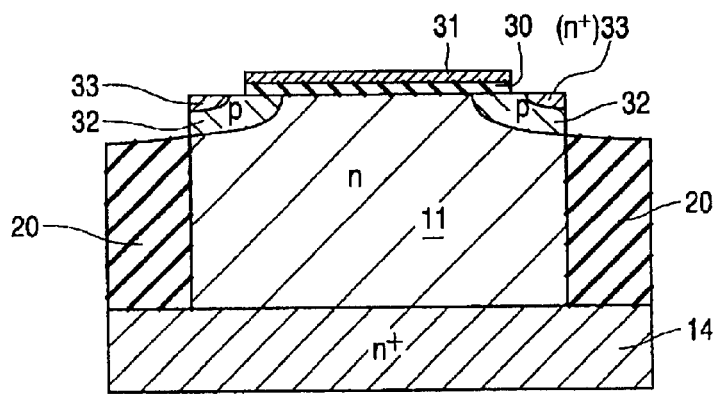
Figure 2D:
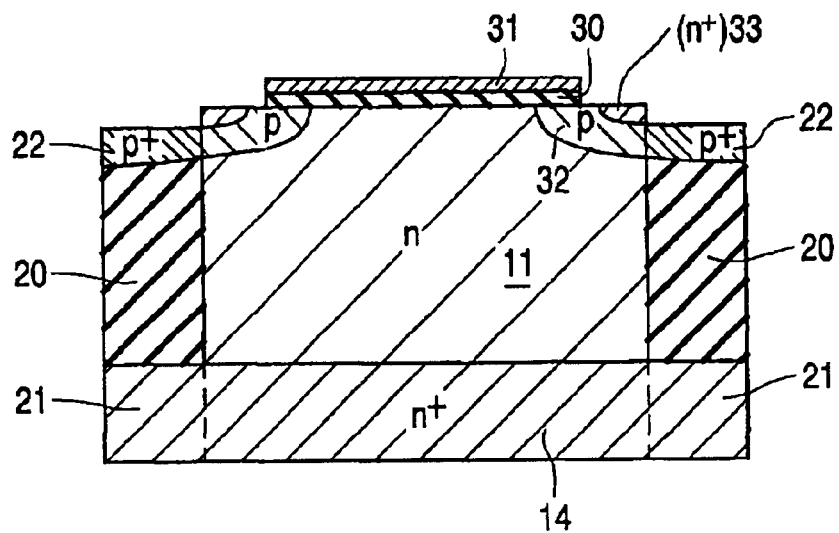
Figure 2E:
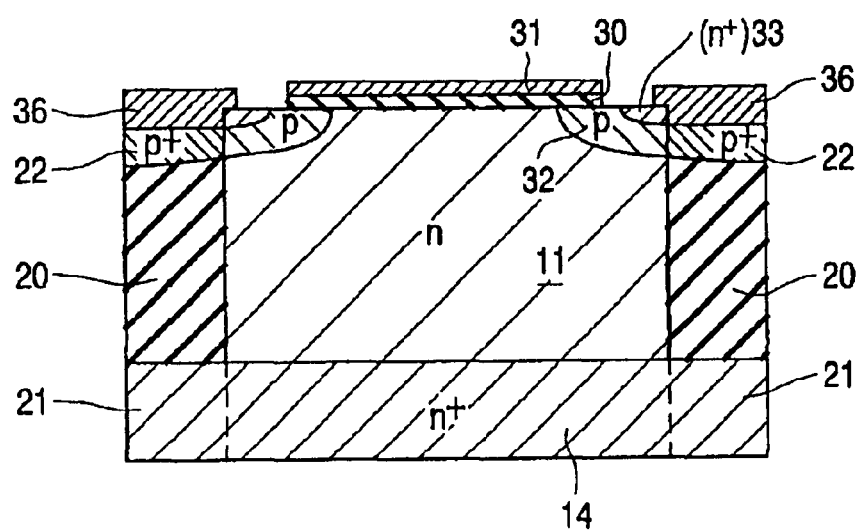

FIGS. 2A to 2E illustrate cross-sectional views of part of a semiconductor body to illustrate steps in one method of manufacturing a VDMOSFET 1 as shown in FIG. 1. For simplicity, the views shown are centred on the insulated gate structure G as shown in FIG. 1 and extend to either side of that central point laterally only as far as midway along the width of the two adjacent field shaping regions 20 as shown in FIG. 1. Initially a semiconductor body is provided consisting of a n+ conductivity type substrate for forming the drain region 14. An n– conductivity type epitaxial layer 110 is grown on the substrate 14 for forming the drain drift region 11. The gate dielectric layer 30 is then grown (or deposited) as silicon dioxide followed by depositing the gate conductive layer 31 as n+ doped polycrystalline silicon. By using known masking and etching techniques the layers 30 and 31 are then patterned to form the gate structure as shown in FIG. 2A. The p type body regions 32 and the n+ type source regions 33 are then successively implanted using appropriate masks and are then driven in with an annealing step. The p body 32 and source 33 profiles extend under the gate oxide 30 as shown in FIG. 2B. After this an anisotropic etching process is carried out, by using a hard mask or possibly by a self-aligned method, to etch trenches through the layers 33, 32 and 110 down to the substrate layer 14. These trenches are then filled, by growth or by deposition, with the capacitor dielectric material 20 and this capacitor dielectric material is then anisotropically etched down to the junction of the p-body 32 and the drift region 11 as shown in FIG. 2C. The p+ second capacitor electrode region 22 is then formed by deposition of, for example, a doped polycrystalline silicon semiconductor layer followed by etch back of this layer down to the junction of the source region 33 and the p body 32 as shown in FIG. 2D. Although not shown, for simplicity, a dielectric layer is then provided over the surface structure and patterned using known masking and etching techniques to define the insulating region 35. Although not shown, a window or windows are formed in the insulating region 35 to enable metallisation to contact the gate conductive layer 31 and then metallisation is deposited and patterned to define the source metallisation 36 as shown in FIG. 2E, and the gate metallisation (not shown in FIG. 1). For simplicity, the insulating regions 23 which separate the field shaping regions 20 from the drift region 11 as shown in FIG. 1, and which as stated in relation to FIG. 1 are optional, have been omitted from the described method. However, they can be included after etching the trenches, which will accommodate the capacitor dielectric material 20, by growing a thermal oxide layer on the exposed silicon surface, and then subjecting this thermal oxide layer to an anisotropic etching process to leave the oxide only on the side walls of the trenches so as to form the insulating regions 23.

Figure 3:
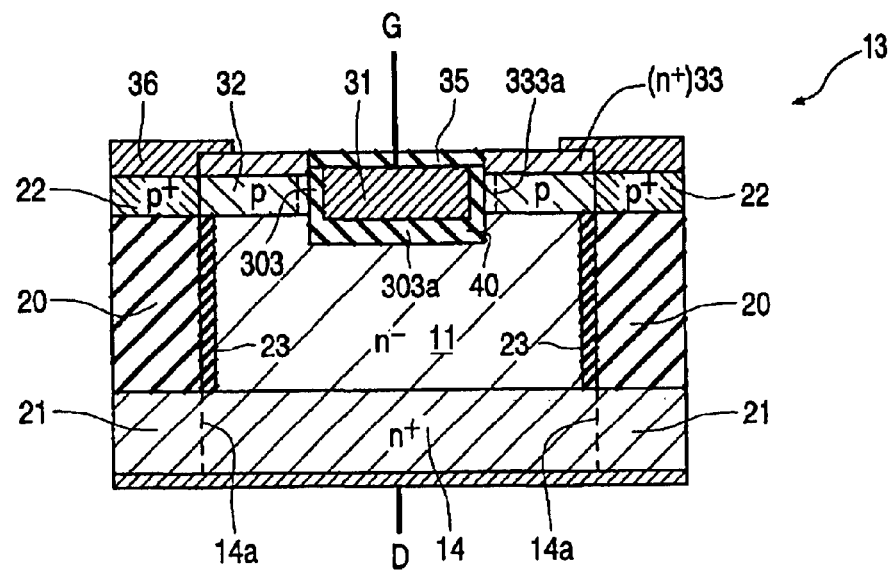
FIG. 3 shows a diagrammatic cross-sectional view through part of one embodiment of a vertical trench-gate field effect transistor semiconductor device in accordance with the present invention.

Referring now to FIG. 3, this shows a vertical trench-gate insulated gate field effect transistor semiconductor device 13. As is conventional for these devices, a trench-gate gate structure comprises a trench 40 extending into the semiconductor body from the top surface thereof past the n+ source region 33 and the p body channel accommodating region 32 into the drain drift region 11. An insulating layer 303, 303a is provided between gate conductive material 31 in the trench 40 and the semiconductor body adjacent the trench. Part of the body region 32 defines a conduction channel region 333a next to the gate insulation 303 at the side of the trench. A top insulating layer 35 is provided over the gate conductive material 31.

The structure of the device 13 described so far forms a conventional vertical trench-gate MOSFET. However, in the same manner and with the same effect as for the device 1 shown in FIG. 1, the device 13 also has capacitor dielectric field shaping regions 20 each with an n+ semiconductor first capacitor electrode region 21 and a p+ semiconductor second capacitor electrode region 22.

The vertical trench-gate transistor device as described with reference to FIG. 3 may be a high voltage DC power device, that is with breakdown voltages above about 200 volts, where the on resistance of the device is mainly determined by the resistance of the drain drift region. However, this vertical trench-gate device may also be a medium or low voltage device, that is with breakdown voltage respectively below about 200 volts or below about 50 volts. For 50 volts and less the on resistance of the device is mainly determined by the resistance of the channel accommodating region. In these devices, the punch-through condition voltage depends on the integral of the hole concentration in the channel-accommodating p-body, region 32 as shown in FIG. 3. The higher the integral of this hole concentration the higher is the drain-source voltage at which punch-through occurs. If the maximum electric field induced by the drain-source voltage in the drain drift region, region 11 as shown in FIG. 3, is reduced then the integral of the hole concentration is increased. Thus the field shaping regions 20, by reducing this maximum electric field, increase the punch-through voltage. Thus the effect of the field shaping regions 20 is that, for a given punch-through voltage, the integral of the hole concentration in the p-body region 32 can be reduced which yields a reduction in the channel resistance. However, in these devices the field shaping regions 20 may tend to increase the gate to drain charge of the transistor.

The device 13 as shown in FIG. 3 shows an extra feature which can be employed when it is used as a low voltage device. This is that the gate insulation 303a at the bottom of the trench-gate is greater than the gate insulation 303 at the sides of the trench-gate adjacent the channel accommodating region 32. This greater insulation 303a reduces the gate to drain charge of the transistor and so counteracts the possible disadvantageous effect mentioned above. The gate insulation 303a at the bottom of the trench-gate may be of the same material as the gate insulation 303 adjacent the channel-accommodating region 32 but of greater thickness. Alternatively, the greater gate insulation 303a may be provided by a sandwich of layers of different dielectric materials.

Figure 4:
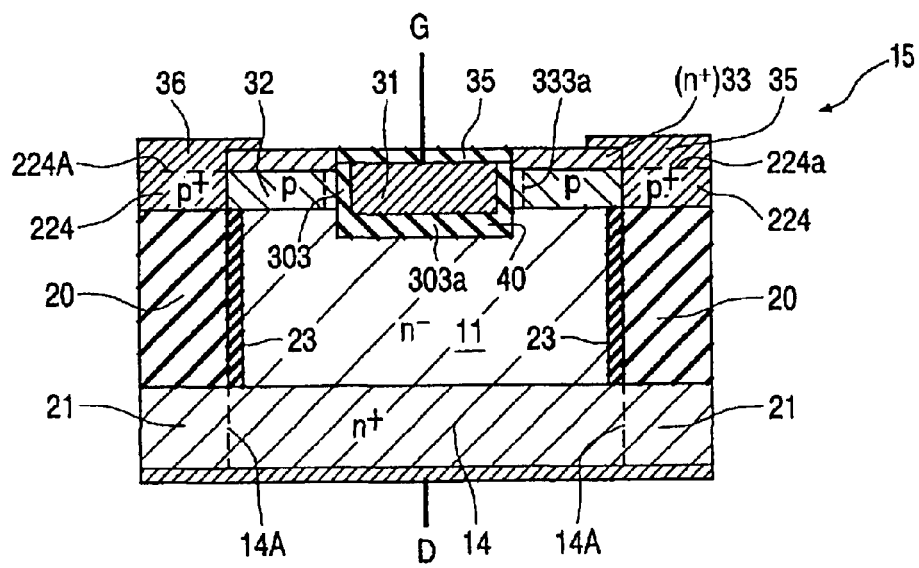
FIG. 4 shows a diagrammatic cross-sectional view through part of another embodiment of a vertical trench-gate field effect transistor semiconductor device in accordance with the present invention.

Referring now to FIG. 4, this shows a vertical trench-gate insulated gate field effect transistor semiconductor device 15 which is a modification of the device 13 shown in FIG. 3. The only modification consists in that, instead of the second capacitor electrode regions being the p+ semiconductor regions 22 of FIG. 3, the second capacitor electrode regions are Schottky barrier regions 224. Each region 224 may be formed by a continuation of the source metallisation 36 down to the capacitor dielectric field shaping region 20; or the region 224 may be formed with an intermetallic compound, for example a silicide, at the boundary with the region 20. The dotted line 224a shows a nominal boundary of the second capacitor electrode region 224 with the source metallisation 36. In this case the work function of the first capacitor electrode semiconductor region 21 is an electron energy barrier which is different from the Schottky electron energy barrier of the second capacitor electrode Schottky barrier region 224, and it is this difference in electron energy barriers which ensures than an applied voltage capacitively generates the substantially constant electric field in the field shaping region 20. In this embodiment a p+ layer for contacting the p-body with the metal contact is located in the third dimension, thereby having an ohmic contact between the p-body and the source metal electrode.

Referring now to FIGS. 5A and 5B, there is respectively shown a diagrammatic cross-sectional view and a plan view of a planar gate lateral insulated gate field effect transistor semiconductor device 17. The n+ source region 335, the n+ drain region 145 and the n− drain drift region 115 are underneath a top major surface 10a of the device 17. A planar insulated gate having a gate dielectric layer 305 and a gate conductive layer 315 is above the top major surface 10a. A p body channel-accommodating region 325 is also underneath the surface 10a and defines with the source region 335 a conduction channel region 335a under the insulated gate. A field shaping capacitor dielectric region 205, a first n+ semiconductor capacitor electrode region 215 and a second p+ semiconductor capacitor electrode region 225 are above the top major surface 10a and separated from the drain drift region 115 by an insulating region 235. A drain metallisation electrode 165 contacts the drain region 145 and the first capacitor electrode region 215. A source metallisation electrode 365 contacts the source region 335 and an adjacent p+ region 50, and extends over an insulation layer 355 covering the gate conductive layer 315 to contact the second capacitor electrode region 225. The device 17 may be made as illustrated using a silicon layer on insulating substrate (SOI) process involving a buried oxide layer 51 on a substrate 52. The substrate 52 may be heavily doped and act as a gate which induces a substantially uniform electric field in the bottom part of the device.

Referring now to FIGS. 6A, 6B and 6C, there are respectively shown two diagrammatic cross-sectional views through and a plan view of part of another planar gate lateral insulated gate field effect transistor semiconductor device 171. The n+ source region 336, the n+ drain region 146 and the n-drain drift region 116 are underneath a top major surface 10a of the device as shown in FIG. 6A. A planar insulated gate having a gate dielectric layer 306 and a gate conductive layer 316 is above the top major surface 10a. A p body channel accommodating region 326 is underneath the surface 10a and defines with the source region 336 a conduction channel region 336a under the insulated gate. As can be seen from FIGS. 6B and 6C, the drain drift region 116 is divided into laterally spaced sections, and a field shaping capacitor dielectric region 206 is divided into laterally spaced sections which alternate with the drain drift sections. A first n+ semiconductor capacitor electrode region 216 is formed by integral portions of the drain region 146 which are adjacent the sections of the capacitor dielectric region 206. A second, p type semiconductor, capacitor electrode region 226 is formed by integral portions of the p body region 326 and adjacent p+ region 50 which are adjacent the sections of the capacitor dielectric region 206. A drain metallisation electrode 166 contacts the drain region 146 and the first capacitor electrode region 216. A source metallisation electrode 366 contacts the source region 336 and the adjacent p+ region 50 which is part of the second capacitor electrode region 226. The device 171 may be made using a SOI process in a similar manner to the device 17 shown in FIGS. 5A and 5B.

Referring now to FIGS. 7A, 7B and 7C, there are respectively shown two diagrammatic cross-sectional views through and a plan view of part of a lateral trench-gate insulated gate field effect transistor semiconductor device 172. The device 172 is similar to the device 171 shown in FIGS. 6A to 6C, with the modification that the insulated gate extends below the top major surface 10a at the end of the drain drift sections 116 opposite the drain region 146. Thus the section view FIG. 7B looks the same as the section view FIG. 6B, whereas FIGS. 7A and 7C show the trench-gate portions 316a, 306a of the insulated gate.

Referring now to FIG. 8, there is shown a diagrammatic cross-sectional view through part of a lateral Schottky gate field effect transistor semiconductor device 181. The device 181 comprises a gallium arsenide semiconductor body 108, having a top major surface 10a, which may be on an insulating or a low doped semiconductor substrate 109. An n+ type source region 338, an n– or n-type junction region 328, an n-type drain drift region 118, and an n+ type drain region 148 are underneath the top surface 10a. A metal or silicided metal Schottky gate 318 contacts the junction region 328 on top of the surface 10a.

The structure of the device 181 described so far forms a conventional lateral MESFET. However, the device 181 also has a field shaping capacitor dielectric region 208 and a first n+ semiconductor capacitor electrode region 218 above the top major surface 10a and separated from the drain drift region 118 by an insulating region 238. A drain metallisation electrode 168 contacts the drain region 148 and the first capacitor electrode region 218. A source metallisation electrode 368 contacts the source region 338 and extends over an insulation layer 358 covering the Schottky gate region 318 to directly, or via a silicided region, contact the end of the capacitor dielectric region 208 opposite the first capacitor electrode region 218. The contact of the electrode 368 with the capacitor dielectric region 208 forms a second capacitor electrode region as a Schottky barrier region 228. The dotted line 228a shows a nominal boundary of the second capacitor electrode region 228 with the source metallisation 368.

Referring now to FIG. 9, there is shown a diagrammatic cross-sectional view through part of a lateral Schottky gate field effect transistor semiconductor device 182 which is the same as the device 181 shown in FIG. 8 with the modification that the Schottky barrier region second capacitor electrode region 229 is formed by the contact of the metal or silicided metal Schottky gate 318 of the device 182 with the capacitor dielectric region 208. The dotted line 229a shows a nominal boundary of the second capacitor electrode region 229 with the device Schottky gate 318.

Referring now to FIG. 10, there is shown a diagrammatic cross-sectional view through part of a vertical Schottky gate field effect transistor semiconductor device 182, that is the device 183 is a vertical MESFET or Static Induction Transistor (SIT). The device 183 has an n+ drain region 149 on top of which are successively an n– drain drift region 119, an n– or n-type junction region 329 and an n+ source region 339. A drain electrode 169 contacts the drain region 149 and a source electrode 369 contacts the source region 339. A metal or silicided metal Schottky gate 319 contacts the side of the junction region 329. Field shaping capacitor dielectric regions 209 are provided at the side of the drain drift region 119 and separated therefrom by insulating regions 239. Each capacitor dielectric region 209 has a first capacitor electrode region 219 which is integral with the drain region 149, as shown by the dotted lines 149a, adjacent the lower end of the region 209. A Schottky barrier region second capacitor electrode region 2291 is formed by the contact of the metal or silicided metal Schottky gate 319 of the device 183 with the capacitor dielectric region 209. The dotted line 2291a shows a nominal boundary of the second capacitor electrode region 2291 with the device Schottky gate 319.

The Schottky gate field effect devices 181, 182 and 183 shown in FIGS. 8, 9 and 10 may be modified in that the device Schottky gate may be formed with a sandwich of different semiconductor materials, for example InAlAs and InGaAs, or AlGaN/GaN and AlGaAs/GaAs. Such devices are known as high electron mobility transistors (HEMTs).

Referring now to FIG. 11, there is shown a diagrammatic cross-sectional view through part of an insulated gate bipolar transistor semiconductor device (IGBT) 19. The device 19 is a modification of the planar gate vertical insulated gate field effect transistor semiconductor device 1 shown in FIG. 1 in that there is a p+ semiconductor region 150, that is of opposite conductivity type to the drain region 14, between the drain region 14 and the drain electrode 16. The p+ region 150 acts as a bipolar emitter, the drain region 14 and drain drift region 11 also act as a bipolar base, and the body region 32 also acts as a bipolar collector. All the other insulated gate field effect transistor semiconductor devices described and shown above, that is the devices shown in FIGS. 3, 4, 5A and 5B, 6A to 6C, and 7A to 7C can similarly be modified to be IGBT devices.

Referring now to FIG. 12, there is shown a cross-sectional view through part of a planar gate vertical insulated gate field effect transistor semiconductor device 12 which is a modification of the device 1 shown in FIG. 1. In the device 12, the first capacitor electrode region 21 and the second capacitor electrode region 22 are respectively connected to electrodes V2 and V1, neither of which are a drain, source or gate electrode of the device. The insulating region 23 between the capacitor dielectric field shaping region 20 and the drain drift region 11 is extended by a portion 23a up to the top body surface 10a so as to isolate the second capacitor electrode region 22 from the p body region 32 and the source electrode 36. Metallisation can thus be provided for the independent electrode V1 contacting the second capacitor electrode region 22. The insulating region is also extended by a portion 23b which extends down into and across the drain region 14, thus providing for the electrode V2 to contact the first capacitor electrode region 21. The electrode V2 is taken upwards to the surface of the semiconductor body in the third dimension (not shown in the drawing). In the process of etching trenches as has been described above with reference to FIG. 2C, these trenches can be extended down into the drain region 14. In this case, the thermal oxide layer which is grown to form the insulating region 23 is not anisotropically etched and is thus left at the bottom of the trench to form part of the portion 23b. The n+ semiconductor first capacitor electrode region 21 is then formed by deposition before providing the capacitor dielectric material 20 in the trench. An alternative way of providing insulation 23b at the bottom of the trenches could be to use a silicon on insulation (SOI) process and using the buried oxide layer of this process. It is possible to provide only the one independent device electrode V1 by omitting the insulation region extension 23b.

A possible advantageous use for the device 12 of FIG. 12 is where the device is an RF device so that only a constant DC voltage, or current, may be applied to the field shaping region via the independent electrodes V1 and V2 to the first and second capacitor electrode regions while the drain source and gate electrodes are used for application of the RF signal together with this constant DC voltage, or current. Apart from the device 1 of FIG. 1 being modified to provide one or both independent electrodes to the field shaping region as shown in FIG. 12, any of the other above described example may be similarly modified.

In the above described examples the source regions are semiconductor regions. However, the source regions could be provided by Schottky metallisation such as silicide, for example platinum silicide, forming a Schottky barrier with the body regions.

It will, of course, be appreciated that the present invention may also be applied where the conductivity types given are reversed and that semiconductor materials other than silicon may be used such as germanium or germanium silicon alloys.

What is claimed is:

1. A field effect transistor semiconductor device comprising: a source region, a drain region disposed beneath the source region and a drain drift region disposed above the drain region; a field shaping region disposed between a first capacitor electrode and a second capacitor electrode and adjacent the drift region and arranged such that, in use, when a voltage is applied between the source and drain regions and the device is non-conducting, a substantially constant electric field is generated in the field shaping region and accordingly in the adjacent drift region, wherein the field shaping region is arranged to function as a capacitor dielectric region between the first capacitor electrode region and the second capacitor electrode region, the first and second capacitor electrode regions being adjacent respective ends of the dielectric region and having different electron energy barriers.

2. A device as claimed in claim 1, wherein the capacitor dielectric region is intrinsic semiconductor material.

3. A device as claimed in claim 1, wherein the capacitor dielectric region is extrinsic semiconductor material which is lower doped than the drift region.

4. A device as claimed in claim 1, wherein the capacitor dielectric region is a semi-insulating material.

5. A device as claimed in claim 1, wherein the capacitor dielectric region (20) is separated from the drift region (11) by an insulating region (23).

6. A device as claimed in claim 1, wherein the first capacitor electrode region (21) is a semiconductor region of the same conductivity type as the drain region and the second capacitor electrode region (22) is a semiconductor region of opposite conductivity type to the first capacitor electrode region (21).

7. A device as claimed in claim 1, wherein the first capacitor electrode region (21) is a semiconductor region of the same conductivity type as the drain region and the second capacitor electrode region (224) is a Schottky barrier region.

8. A device as claimed in claim 1, wherein the transistor is an insulated gate field effect transistor (1, 13, 15, 17, 171, 172, 19, 12).

9. A device as claimed in claim 8, wherein the transistor is a vertical transistor.

10. A device as claimed in claim 9, wherein the vertical transistor is a trench-gate transistor.

11. A device as claimed in claim 10, wherein the gate insulation at the bottom of the trench-gate is greater than the gate insulation adjacent the channel accommodating region so as to reduce the gate to drain charge of the transistor.

12. A device as claimed in claim 8, wherein the transistor is a lateral transistor having the source region, the drain region and the drain drift region underneath a top major surface of the device, wherein a planar insulated gate is above said top major surface, and wherein the capacitor dielectric region and the first and second capacitor electrode regions are above said top major surface.

13. A device as claimed in claim 8, wherein the transistor is a lateral transistor having the source region, the drain region and the drain drift region underneath a top major surface of the device, wherein the drain drift region is divided into laterally spaced sections, and wherein the capacitor dielectric region is underneath the top major surface and is divided into laterally spaced sections which alternate with the drain drift sections.

14. A device as claimed in claim 8, wherein the transistor is an insulated gate bipolar transistor (19) having a semiconductor region (150) of opposite conductivity type to the drain region (14) between the drain region (14) and a drain electrode (16).

15. A device as claimed in claim 1, wherein the transistor is a Schottky gate field effect transistor (181, 182, 183).

16. A device as claimed in claim 1, wherein the first and second capacitor electrode regions (21, 22) are respectively connected to drain and source electrodes (16, 36).

17. A device as claimed in claim 1, wherein the first and second capacitor electrode regions are respectively connected to drain and gate electrodes (16; G, 318, 319).

18. A device as claimed in claim 1, wherein at least one of the first and second capacitor electrode regions (21, 22) is connected to an electrode (V1, V2) which is not a drain, source or gate electrode.

* * * * *